United States Patent [19]

Newman et al.

[11] 3,941,975
[45] Mar. 2, 1976

[54] GLASS PANEL CIRCUIT BREAKER

[75] Inventors: Irvin Newman, Cherry Hill; Michael G. Kelly, Turnersville, both of N.J.

[73] Assignee: Ira W. Fine, Pennsauken, N.J. ; a part interest

[22] Filed: Apr. 7, 1975

[21] Appl. No.: 565,634

Related U.S. Application Data

[63] Continuation-in-part of Ser. No. 446,429, Feb. 27, 1974, Pat. No. 3,876,862.

[52] U.S. Cl. .............. 219/509; 219/203; 219/522; 219/543
[51] Int. Cl.² ..................... H05B 1/02; H05B 3/06
[58] Field of Search .......... 219/202, 203, 509, 511, 219/522, 541, 543

[56] References Cited
UNITED STATES PATENTS

| | | | |
|---|---|---|---|
| 3,449,551 | 6/1969 | Aisamich | 219/511 |
| 3,475,594 | 10/1969 | Aisamich | 219/509 |
| 3,526,753 | 9/1970 | Aisamich et al. | 219/522 |
| 3,760,157 | 9/1973 | Newman et al. | 219/522 |
| 3,800,121 | 3/1974 | Dean et al. | 219/202 |
| 3,876,862 | 4/1975 | Newman et al. | 219/509 |
| 3,892,947 | 7/1975 | Strengholt | 219/522 |

*Primary Examiner*—Volodymyr Y. Mayewsky
*Attorney, Agent, or Firm*—Howson and Howson

[57] ABSTRACT

A frangible panel having an electrically-energizable layer carried in an area thereof for heating the panel and main circuit means for supplying electrical power to the layer is provided with circuit breaker means operable to interrupt electrical power to the layer upon breakage of the panel. The circuit breaker means includes a fusible link connected in series with the layer and a solid-state control device connected in the main circuit in parallel with the layer. The solid-state device has a control gate which is connected to a sensing circuit surrounding the electrically-energizable layer and which is connected in the main circuit to render the solid-state control device non-conductive as long as the sensing strip is continuous and to render the solid-state control device conductive when the sensing circuit is broken. Thus, the solid-state control device connects the fusible link to ground and causes the link to blow, thereby interrupting power to the electrically-energized layer.

4 Claims, 1 Drawing Figure

U.S. Patent   March 2, 1976   3,941,975
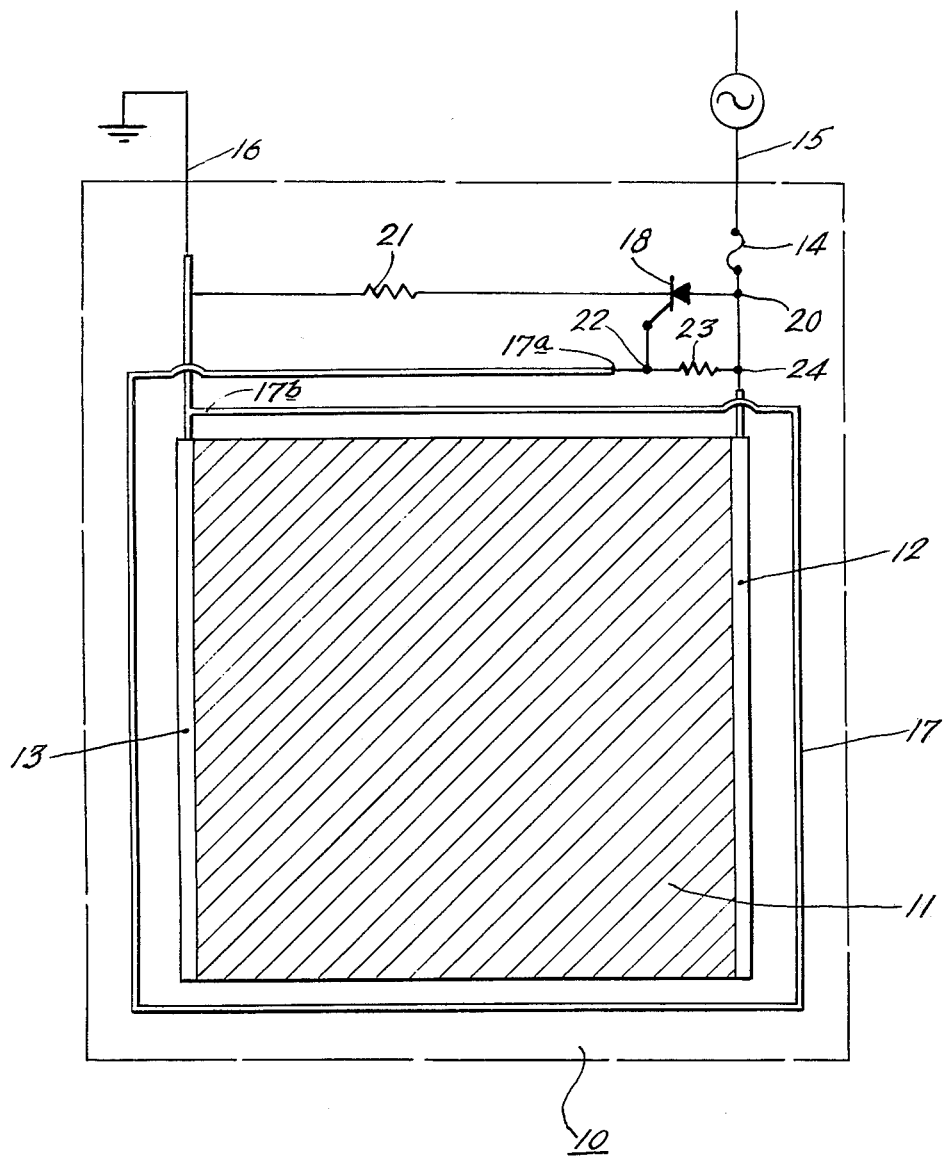

GLASS PANEL CIRCUIT BREAKER

The present application is a continuation-in-part of our copending application Ser. No. 446,429, filed Feb. 27, 1974, now U.S. Pat. No. 3,876,862.

The present invention relates to electrically-energized glass panels; and more particularly, the present invention relates to circuit breaker means for interrupting power to a frangible panel in the event it breaks.

In our aforementioned patent, there are disclosed various embodiments of an invention which operates to interrupt power to an electrically-energized layer on a glass panel in the event the panel breaks or becomes cracked. The various embodiments include circuit breaker means controlled by a solid-state device connected to a sensing circuit strip carried on the panel around the area. When continuity of the strip is broken, as would occur when the panel is cracked or broken, the solid-state device is rendered non-conductive, thereby interrupting power to the panel. Although the apparatus disclosed in our patent operates entirely satisfactorily and safely, there exists a need for apparatus providing an even greater margin of safety.

With the foregoing in mind, it is a primary object of the present invention to provide an electrically-energized glass panel having an improved circuit breaker and breakage-sensing arrangement which operates with the highest degree of safety.

Another object of the present invention is to provide a completely fail-safe system for interrupting power to an electrically-energized glass panel in the event of breakage of the panel.

More specifically, in the present invention, an electrically energizable layer carried in an area of a frangible panel is supplied with electrical energy by main circuit means which includes a pair of parallel bus bars carried on the panel. A fusible link is connected in series with the high-voltage bus bar, and a solid-state device is connected in parallel with the layer across the bus bars. The solid-state device has a control gate which is connected to the low-voltage bus bar by means of a continuous sensing circuit extending around the layer. The gate is also connected to the high-voltage bus through a high-impedance resistor. The sensing circuit renders the solid-state device non-conductive as long as the sensing circuit is continuous and renders the solid-state device conductive when the sensing circuit is interrupted, such as when the panel is broken. As a result, the solid-state device substantially short-circuits the bus bars to blow the fusible link and thereby to interrupt power to the layers on the panel.

These and other objects, features and advantages of the present invention should become apparent from the following description when taken in conjunction with the accompanying drawing which illustrates schematically a frangible panel having the improved breakage sensing and circuit breaker means of the present invention.

Referring now to the drawings, the numeral 10 indicates schematically a frangible panel of glass or other material. A layer of electrically resistive material 11 is secured to the panel 10 in copolanar relation, and power is supplied to the layer 11 by a pair of parallel bus bars 12 and 13 carried on the panel 10 in electrical contact with the layer 11. The bus bar 12 is the high-voltage or hot bus, and the bus bar 13 is the low-voltage or ground bus. Thus, electrical energy supplied to the high-voltage bus 12 flows through the layer 11 to the bus 13 and to ground, causing the layer 11 to generate heat for heating the panel. A typical layer has an impedance between bus bars of about 130-180 ohms. As a result, a current flow of about 1 ampere can be expected to flow through layer 11.

For a more detailed discussion as to the structure and operation of this type of panel, reference is made to our U.S. Pat. No. 3,876,862 issued on Apr. 8, 1975, the disclosure of which is hereby incorporated herein.

In accordance with the present invention, highly safe yet simple circuit breaker means is provided to interrupt power to the electrically-energizable layer 11 in the event the panel 10 breaks. To this end, a fusible link or fuse 14 is connected in series with the high-voltage bus 12, and hence the layer 11, in the main circuit which includes a high-voltage supply lead 15 connected to the high voltage bus 12 and a low voltage lead or ground 16 connected to the ground bus 13. Breakage sensing circuit means 17 in the form of a thin elongated strip is provided on the panel 10 to sense breakage of the panel 10 and to actuate control means 18 to provide a low-impedance shunt around the layer 11 and downstream of the fusible link 14. The sensing circuit means 17 cooperates with the control means 18 to render the same non-conductive as long as the sensing circuit 17 is continuous; however, if the panel breaks, continuity of the sensing circuit means 17 is interrupted, and the control means 18 is actuated to substantially short-circuit the fusible link 14. As a result, the link 14 blows and power to the bus 12 and hence to the layer 11 is thereby interrupted. The fusible link 14 is sized to carry the current normally flowing through the layer 11. Since such current is about 1 ampere for a typical panel, a fuse 14 having a capacity, without blowing, of 1.5 amperes would be provided. The fuse 14 should also be of the "fast blow" type.

In the present instance, the control means 18 is provided by a solid-state device such as a conventional silicon control rectifier (SCR). The anode of the SCR 18 is connected to a terminal 20 downstream of the fusible link 14. The cathode of SCR 18 is connected to a relatively low impedance resistor 21 to the ground bus 13 or ground lead 16. The gate of the SCR 18 is connected to a terminal 22, and a high-impedance resistor 23 connects the terminal 22 to a terminal 24 in the high-voltage supply line 15. One end 17a of the sensing circuit strip is connected to the low-voltage ground bus 13 or lead 16.

Preferably, the low impedance resistor 21 has a value of about 5 ohms, so that when connected across the main circuit 15 and 16, current flow through the fuse 14 exceeds its capacity, causing the fuse 14 to blow. Of course, the low-impedance resistor 21 also protects the SCR 18 against excessive current when the SCR 18 is gated. The value of the low-impedance resistor 21 is substantially lower than the resistance of the layer 11.

In operation, alternating current power (120 V.A.C.) supplied to the main circuit means causes electrical current to flow through the resistance layer 11 from the high-voltage bus 12 to the low-voltage bus 13. At the same time, full power is supplied to the anode of the SCR 18, and a very low voltage is supplied to the gate through the high-impedance resistor 24. The gate of the SCR 18 is connected to the ground lead 16 through the very low-impedance sensing strip 17 so that the voltage supplied to the gate of the SCR 18 is exceedingly low and not of sufficient magnitude to cause it to conduct. In the event the strip 17 becomes broken, however, such as when the panel 10 breaks, a positive voltage sufficient to activate the SCR is applied to the gate of the SCR 18 through the high-impedance resistor 23. As a result, the SCR conducts and provides a low-impedance shunt across the layer 11. This causes the fusible link 14 to blow, thereby interrupting the power to the high-voltage bus 12 and hence to the layer 11. Thus, in the event that a person were to contact the panel after it has been broken, the person would not receive an electrical shock.

While the disclosed circuit breaker means has been described in combination with a sensing strip completely surrounding an electrically-energizable layer, it is contemplated that any one of the sensing strips and breaker mounting arrangements disclosed in our aforementioned patent may be utilized satisfactorily therewith.

In view of the foregoing, it should be apparent that there has now been provided a highly safe and effective circuit breaker and sensing circuit arrangement for use in combination with electrically energized glass panels to interrupt power to the panels in the event of breakage.

While a preferred embodiment of the present invention has been described in detail, various modifications, alterations or changes may be made without departing from the spirit and scope of the present invention as defined in the appended claims.

We claim:

1. In combination with a frangible panel having an electrically-energizable layer secured thereto in coplanar relation and main circuit means having upper and lower voltage level leads for supplying electrical power to said layer, the improvement comprising: circuit breaker means connected in said main circuit for interrupting electrical power to said electrically-energizable layer upon breakage of said panel, electrically-actuated control means operable to cause said breaker means to conduct electricity when said main circuit means is energized, and a frangible sensing circuit strip carried by said panel and extending around a substantial portion of said electrically-energizable layer to detect breakage of said panel, said circuit breaker means including a fusible link connected in series with said upper voltage lead in said main circuit means and in series relation with said electrically-energizable layer, said control means including a solid-state device connected in said main circuit means in parallel relation with said electrically-energizable layer and in series with said fusible link, said solid-state device having gate means operable to render said solid state control device selectively conductive and non-conductive, and means electrically connecting one end of said sensing circuit strip to said gate means and the upper voltage lead and means electrically connecting the other end of said sensing circuit strip to the lower voltage lead in said main circuit means to maintain said solid-state control device non-conductive so long as said sensing circuit strip is continuous and to cause said solid-state control device to conduct when continuity of said sensing circuit strip is interrupted, whereby the solid state control device shunts the electrically-energizable layer and blows the fusible link to interrupt power to the electrically-energizable layer.

2. Apparatus according to claim 1 wherein said solid state control device conducts electricity upon application of a positive voltage to said gate means, and said means electrically connecting said gate means to said upper voltage level lead includes a resistor having a high impedance relative to the impedance of said frangible sensing strip between said gate means and said low voltage level lead, so that said strip normally applys voltage at substantially said lower voltage level to said gate until said strip is interrupted, whereby a positive voltage is applied to the gate means to render the solid state control device conductive for blowing the fusible link.

3. Apparatus according to claim 2 wherein said solid state control device includes a silicon control rectifier having its anode electrically connected to said upper voltage lead and its cathode connected to said lower voltage lead through another resistor having an impedance substantially lower than the impedance of said layer across said upper and lower voltage leads.

4. Apparatus according to claim 3 wherein said fusible link has a current-carrying capacity sufficient to carry current to said energizable layer during normal operation thereof but insufficient to carry current through said solid-state device and said another resistor when activated upon breakage of said sensing strip.

* * * * *